(12) United States Patent
Morrish

(10) Patent No.: US 7,974,061 B2
(45) Date of Patent: Jul. 5, 2011

(54) COMMON GATE CONNECTED HIGH VOLTAGE TRANSIENT BLOCKING UNIT

(75) Inventor: Andrew J. Morrish, Saratoga, CA (US)

(73) Assignee: Bourns, Inc., Riverside, CA (US)

( * ) Notice: Subject to any disclaimer, the term of this patent is extended or adjusted under 35 U.S.C. 154(b) by 535 days.

(21) Appl. No.: 12/283,430

(22) Filed: Sep. 10, 2008

(65) Prior Publication Data
US 2009/0122456 A1 May 14, 2009

Related U.S. Application Data

(60) Provisional application No. 61/001,658, filed on Nov. 2, 2007, provisional application No. 60/993,222, filed on Sep. 10, 2007.

(51) Int. Cl.
*H02H 9/00* (2006.01)
(52) U.S. Cl. .................................... 361/111
(58) Field of Classification Search .............. 361/111
See application file for complete search history.

(56) References Cited

U.S. PATENT DOCUMENTS

| 5,742,463 | A | 4/1998 | Harris | |
|---|---|---|---|---|
| 6,954,347 | B1 | 10/2005 | Chaudhry | |
| 7,324,315 | B2* | 1/2008 | Harris | 361/58 |
| 7,576,962 | B2* | 8/2009 | Harris | 361/58 |
| 7,616,418 | B2* | 11/2009 | Harris | 361/58 |
| 2005/0128669 | A1 | 6/2005 | Harris | |
| 2005/0180080 | A1 | 8/2005 | Harris | |
| 2006/0098363 | A1 | 5/2006 | Hebert et al. | |

* cited by examiner

*Primary Examiner* — Stephen W Jackson
(74) *Attorney, Agent, or Firm* — Lumen Patent Firm

(57) ABSTRACT

When a series protective element such as a transient blocking unit (TBU) is used in combination with a shunt protective element such as a gas discharge tube (GDT), firing of the GDT can cause a transient having the potential to damage the TBU. This problem can be alleviated by placing a TBU core in series between depletion mode transistors having their gates connected. With this arrangement, the GDT transient causes a transient in the TBU circuit that has the effect of switching the transistors around the TBU hard off, thereby protecting the TBU from the GDT transient.

13 Claims, 3 Drawing Sheets

_US 7,974,061 B2_

COMMON GATE CONNECTED HIGH VOLTAGE TRANSIENT BLOCKING UNIT

CROSS REFERENCE TO RELATED APPLICATIONS

This application claims the benefit of U.S. provisional patent application No. 60/993,222, filed on Sep. 10, 2007, entitled "Common Gate Connected High Voltage TBU", and hereby incorporated by reference in its entirety. This application also claims the benefit of U.S. provisional patent application No. 61/001,658, filed on Nov. 2, 2007, entitled "Common Gate Connected High Voltage Transient Blocking Unit", and hereby incorporated by reference in its entirety.

FIELD OF THE INVENTION

This invention relates to suppression of electrical transients.

BACKGROUND

A transient blocking unit (TBU) is a circuit including two or more normally-on transistors that rapidly and automatically switches to a high-impedance current blocking state in response to an over-current condition. A TBU placed in series with a load will thereby protect that load from the over-current condition. For this reason, TBUs find application as series protective elements for sensitive electrical loads. One early reference describing transient blocking units is U.S. Pat. No. 5,742,463.

In many situations, it is important for TBUs to have high voltage handling capability. Once approach for providing such capability is to simply fabricate the basic TBU circuit with transistors having the required voltage rating. However, this approach is often troublesome in practice, because key TBU parameters such as the TBU threshold current (i.e., the current above which the device will turn off) depend on the device parameters of the TBU transistors. It is often difficult and/or costly to provide tight control of device parameters of high voltage transistors. Thus a TBU including high voltage transistors in such a manner that the device parameters of the high voltage transistors determine TBU parameters such as threshold current will suffer from reduced yield and increased cost.

An alternative approach can be referred to as a "core TBU" approach. In this approach, a relatively low voltage TBU is connected to high-voltage transistors such that the overall circuit acts as a high voltage TBU. The use of a low voltage TBU core to control the high voltage transistors can advantageously simplify TBU design. For example, with the TBU core approach, the TBU threshold current is set by the TBU core and advantageously does not depend on (poorly controlled) device parameters of the high voltage transistors. Some aspects of the TBU core approach are considered in US 2006/0098363.

FIG. 1 shows an example of a TBU core circuit as described in US 2006/0098363. In this example, TBU core 102 includes normally-on transistors Q1, Q2, and Q3, and diodes D1 and D2, connected so as to provide transient blocking functionality. TBU core 102 is connected to normally-on high voltage transistors Q4 and Q5 such that when TBU core 102 switches to its high impedance state, at least one of Q4 and Q5 is thereby switched off. Thus, TBU core 102 sets the current threshold, while Q4 and Q5 provide the high voltage handling capability.

SUMMARY

However, it has been found that there are circumstances in which conventional TBU core approaches (e.g., as described above) do not provide optimum protection to the application device being protected. In particular, problems can arise when the transient being blocked is oscillatory at a high frequency (e.g., greater than 10 MHz). The need to block high frequency oscillatory transients arises frequently in practice, especially in cases where a TBU is used in combination with a shunt protecting element (e.g., a gas discharge tube), as part of the overall transient suppression approach. The firing of a gas discharge tube as it engages to shunt current flow will typically result in a high frequency oscillatory transient being presented to the TBU. In other applications, such as certain aeronautical applications, protection against very high frequency, high voltage transients may be required for protection against certain types of lightning strikes.

When a high frequency oscillatory transient is provided to a conventional TBU circuit, the TBU can undesirably undergo active switching during the transient, as opposed to remaining in the TBU blocking state of maintaining a low level constant current. As a result of this behavior, the TBU may be periodically reset by the high frequency transient, resulting in the passage of a high frequency current, which can subject both the load being protected and the TBU itself to excessive electrical stress (e.g., above-rating power dissipation) during the transient, and may thereby lead to equipment damage. The reason for this behavior can be understood from the observation that in the circuit of FIG. 1, TBU core 102 and transistor Q4 act together to block parts of the transient having one polarity, and TBU core 102 and transistor Q5 act together to block parts of the transient having the other polarity. As the voltage passes through zero volts, the TBU resets to its conductive state. Thus, an oscillatory transient with a period that is faster than the normal reaction time of the TBU will require TBU core 102 to switch between two states faster than it can respond, which may result in high current transients through the TBU, and into the protected equipment.

According to embodiments of the invention, this problem can be alleviated by providing a two-terminal connection between the gates of the high voltage transistors. In operation, this modified TBU circuit has the desirable property that both of the high voltage transistors can remain in an off state after the TBU core threshold is exceeded, even in the presence of an oscillatory transient. In this manner, the TBU core is protected from the above-described active switching problem.

DETAILED DESCRIPTION

Figure 2:
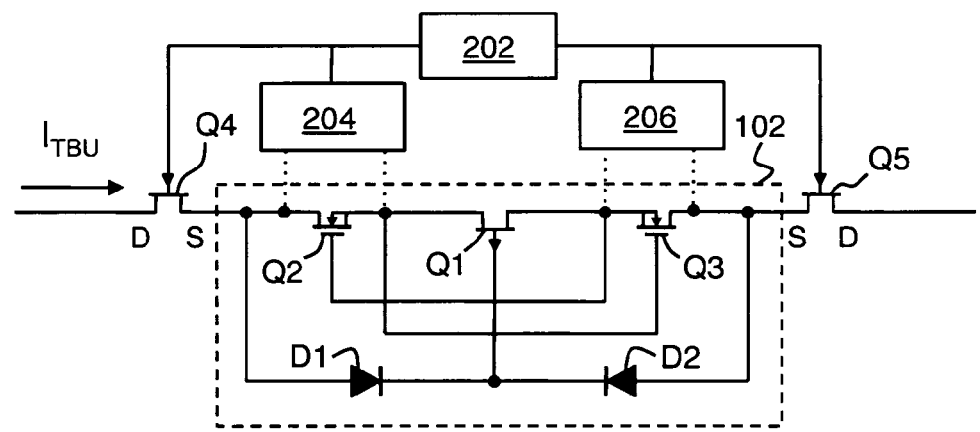
FIG. 2 shows a high voltage transient blocking unit according to an embodiment of the invention.

FIG. 2 shows a high voltage transient blocking unit according to an embodiment of the invention. In this example, a TBU core 102 includes depletion mode (i.e., normally-on) core transistors Q1, Q2, and Q3 connected in series. TBU core 102 automatically switches to a high-impedance current blocking state when current through TBU core 102 exceeds a predetermined threshold. This behavior is based on a positive feedback, where voltages generated by current flow through TBU core 102 are provided to gates of Q1, Q2, and/or Q3 so as to tend to switch the transistors off. For currents below the TBU threshold, this tendency to switch the TBU off has negligible effect. For currents above the TBU threshold, positive feedback sets in, and the TBU rapidly and automatically switches to its current blocking state. Diodes D1 and D2 on FIG. 2 serve to prevent current flow to or from the gate of Q1, which can be a junction field effect transistor (JFET) as shown. In other embodiments, D1 and D2 may be replaced by resistors.

The example of FIG. 2 also includes a first depletion mode transistor Q4 and a second depletion mode transistor Q5. TBU core 102 is connected in series with and between transistors Q4 and Q5. When TBU core 102 is in its high impedance current blocking state, it can provide gate voltages to switch off Q4 and/or Q5. Typically, Q4 and Q5 are high voltage transistors having greater voltage handling capability than core transistors Q1, Q2, and Q3.

Figure 1:
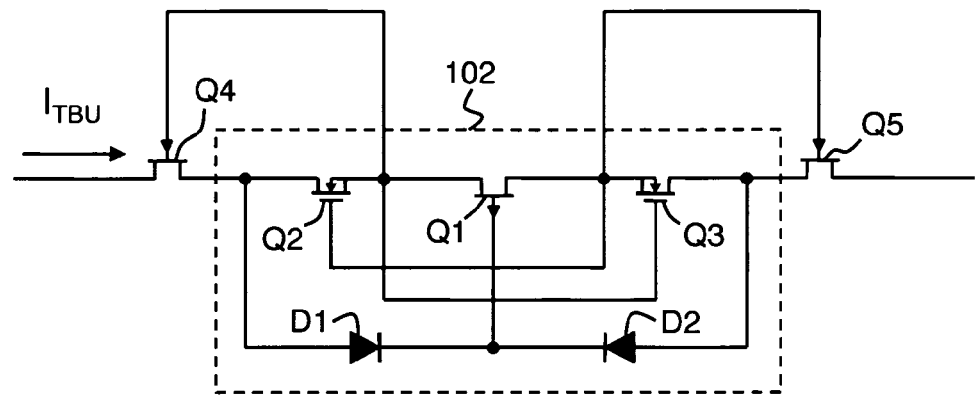
FIG. 1 shows a prior art high voltage transient blocking unit.

The circuit of FIG. 2 differs from the conventional circuit of FIG. 1 by the addition of two-terminal gate-gate circuit 202 on FIG. 2. Here circuit 202 has its terminals connected to the gates of Q4 and Q5. Circuit 202 is a two-terminal circuit. In other words, it has exactly two connections (i.e., its terminals) to the rest of the circuit. Circuit 202 is preferably passive, which is hereby defined as including wires, resistors, capacitors, inductors, and/or diodes, and excluding any active gain elements, such as transistors, thyristors etc.

In some cases, circuit 202 can include a conductive connection between its terminals (e.g., a wire or board trace), which, for example, could be equivalent to a direct connection of the gate of Q4 to the gate of Q5. In other cases, circuit 202 can include two zener diodes connected in series with opposite diode polarity. This situation is equivalent to a direct connection between the gates of Q4 and Q5, with an offset voltage set by the zener diode breakdown voltage.

By connecting the gates of transistors Q4 and Q5 via two-terminal circuit 202, TBU operation can be substantially improved. Using this circuit it is possible to generate a controlling voltage on the gates of transistors Q4 and Q5 that controls these devices separately from the control normally provided by the core circuit. In particular, TBU circuits of the type shown on FIG. 2 can exhibit the desirable property of keeping both Q4 and Q5 turned off for the duration of an oscillatory transient, thereby avoiding the undesirable active switching of TBU core 102 during the transient as described above.

The circuit of FIG. 2 also includes a first gate-source network 204 and a second gate-source network 206. As will be seen in the following examples of FIGS. 3-6, networks 204 and 206 can provide various functions, such as providing a discharge path for the gate-source capacitances of Q4 and Q5, gate-source voltage clamping for Q4 and Q5, and/or bias control for Q4 and Q5. In the schematic of FIG. 2, network 204 is shown connected to both drain and source of Q2 with dotted lines. This is to indicate that embodiments of the invention can include at least one of these two connections, but not necessarily both. Network 206 is shown connected to both source and drain of Q3 with dotted lines on FIG. 2 for the same reason.

Figure 3:
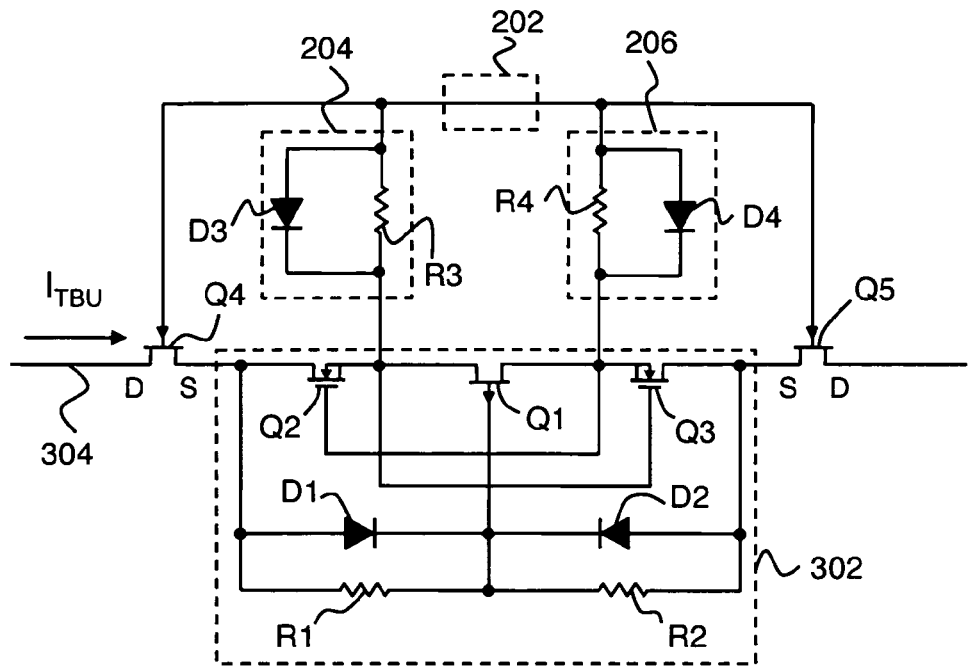
FIG. 3 shows a high voltage transient blocking unit according to a first preferred embodiment of the invention.

FIG. 3 shows a high voltage transient blocking unit according to a first preferred embodiment of the invention. In this embodiment, two-terminal gate-gate circuit 202 of FIG. 2 is a direct connection of the gate of Q4 to the gate of Q5. Transistors Q1, Q2 and Q3 are the TBU core transistors of this example. Resistors R1 and R2 are bias resistors (nominally 130 kΩ) for the TBU core. Circuit operation does not depend critically on these bias resistances. Under normal operation (i.e., TBU core 302 conducting), diodes D3 and D4 provide voltage references to the gates of Q4 and Q5, so that normal cascode operation is ensured (i.e., Q4 and Q5 conducting). Diodes D3 and D4 are preferably fast signal diodes having low capacitance and low stored charge, which are able to turn off quickly. For example, a 1N4148 type diode could be employed here.

During transient blocking, there are two cases to consider, depending on the polarity of the transient being blocked. In case 1, TBU core transistors Q1 and Q2 switch off, and the resulting voltage drop initially appears at the gate of Q4 and tends to switch it off. In case 2, TBU core transistors Q1 and Q3 switch off, and the resulting voltage drop initially appears at the gate of Q5 and tends to switch it off. Here it is helpful to define normal TBU operation in the current blocking mode as having transistors which are driven to a "soft off" state, since enough current flows through the "soft off" TBU transistors to generate the gate voltages necessary to maintain blocking. Since circuit operation for these two cases is substantially identical, it suffices to describe circuit operation for case 1.

It is helpful to consider the case 1 sequence of events during transient blocking in greater detail, assuming that a shunt protective element such as a gas discharge tube (GDT) is connected to the TBU input. First, an excessive voltage appears at the TBU input 304. Second, current flow through TBU core 302 exceeds the TBU core threshold current. Third, TBU core 302 switches to its current blocking state. Fourth, a gate voltage is applied to Q4 that switches it "soft off". Fifth, as a result of the TBU switching to its current blocking state, the voltage at TBU input 304 can rise (as driven by the transient) to a level sufficient to cause the GDT to fire. Once this occurs, the voltage at TBU input 304 will drop rapidly to around ground potential, but there can be significant ringing of this input voltage.

This step function transient at the drain of Q4 causes similar transients of the gate and source voltages of Q4, as a result of the drain to gate capacitance ($C_{gd}$) and drain to source capacitance ($C_{ds}$) of Q4. These transients have several significant characteristics. First, the decrease in Q4 gate voltage tends to be substantially greater than the decrease in Q4 source voltage. The gate voltage is determined by the capacitive divider effect of Q4 and Q5 at the junction of the gates. The source voltage is determined by the complex impedance formed by the active circuit of the core, and Q5, which just prior to the transient was turned fully on by the positive gate to source voltage. As a result, the gate-source voltage of Q4 ends up at a value sufficient to switch Q4 "hard off". Here "hard off" is used to refer to a transistor that is switched off in a manner that does not permit the low-level current flow characteristic of the normal TBU current blocking state.

Secondly, the gate-source voltage of Q5 also ends up at a value that turns Q5 "hard off", since the sources of Q4 and Q5 are connected via the core circuit. The main reason for this is that the gate voltage of Q4 can be driven negative to a significant extent by the initial input transient from the GDT firing. For example, when the drain voltage of Q4 has a transient from 1000V to ground, the gate to source voltage of Q4 can end up at around −100V as a result of the drain transient. Since the gates of Q4 and Q5 are connected, this voltage also shows up at the gate of Q5, which is sufficient to switch Q5 "hard off" (the source voltage of Q5 being near ground).

Thus the effect of the GDT transient on the circuit of FIG. 3 is to switch both Q4 and Q5 "hard off", thereby protecting TBU core 302, as well as any series-connected load that may be present, from electrical stress due to the GDT ringing. Transistors Q4 and Q5 remain "hard off" until their gate-source capacitances discharge through resistors R3 and R4. The RC time constant for this discharge process is preferably selected to be greater than the GDT ringing time constant. In one circuit design, suitable resistance values for R3 and R4 were 130 kΩ.

Figure 4:
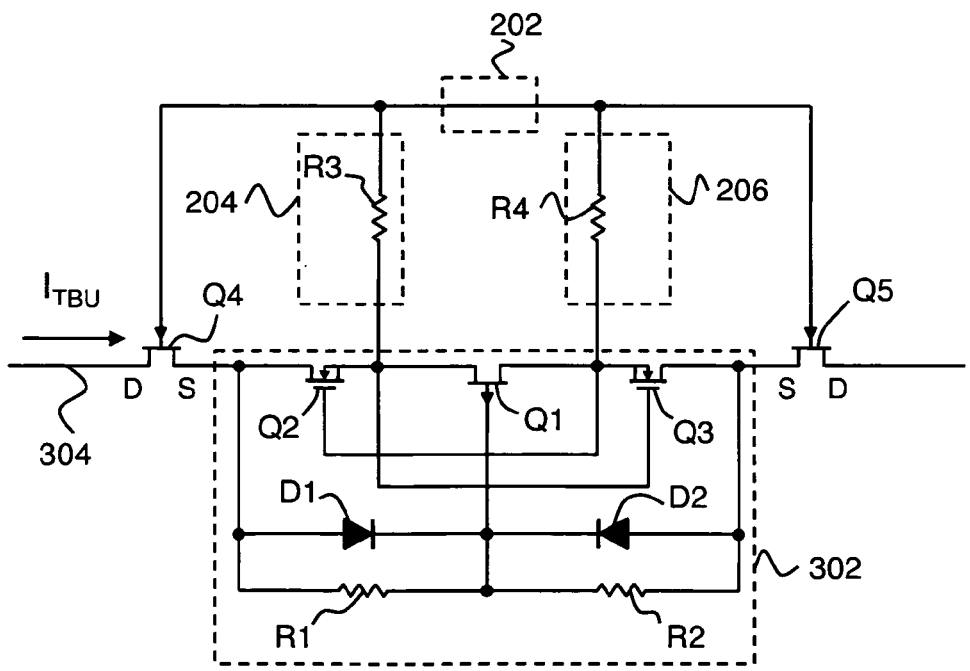
FIG. 4 shows a high voltage transient blocking unit according to a second preferred embodiment of the invention.

FIG. 4 shows a high voltage transient blocking unit according to a second preferred embodiment of the invention. This circuit is the same as the circuit of FIG. 3, except that diodes D3 and D4 are removed. Accordingly, the circuit of FIG. 4 is applicable in cases where diodes D3 and D4 of FIG. 3 are not necessary. If Q4 and Q5 are junction field effect transistors, the gate-source junctions of Q4 and Q5 can provide the same functionality as diodes D3 and D4 of FIG. 3, so this is one situation where the circuit of FIG. 4 can be applicable. Another such situation is where Q4 and Q5 are ESD (electrostatic discharge) diode protected MOSFET transistors, because the ESD protection of such transistors includes a gate-source diode having the appropriate polarity.

Figure 5:
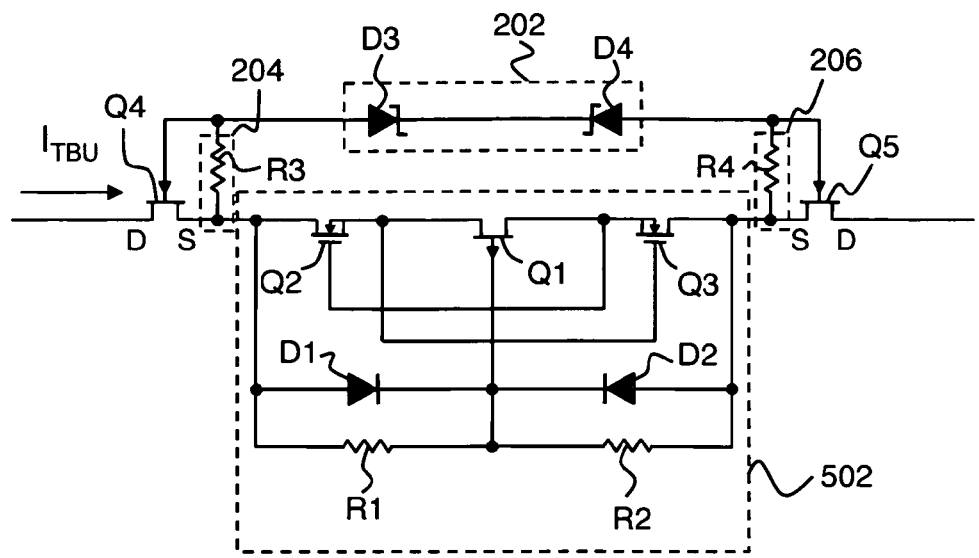
FIG. 5 shows a high voltage transient blocking unit according to a third preferred embodiment of the invention.

FIG. 5 shows a high voltage transient blocking unit according to a third preferred embodiment of the invention. In this circuit, the two-terminal circuit (e.g., 202 on FIG. 2) is zener diodes D3 and D4 connected in series with opposite diode polarity. Diodes D3 and D4 on FIG. 5 provide a voltage offset between the gates of Q4 and Q5, which can be important in cases where the threshold voltages of Q4 and Q5 are less than the operating voltage of TBU core 502. The zener diode breakdown voltage should be greater than the difference between the minimum operating voltage of the TBU core and the threshold of the devices Q4 and Q5 in order that devices Q4 and Q5 do not start to turn off prior to the maximum operating voltage of the TBU core being reached. This ensures that the TBU core is always able to correctly regulate the current within the TBU. For example, if TBU core 502 requires a minimum of 10 V when in the blocking state, and the thresholds of Q4 and Q5 are −4 V, then breakdown voltages for D3 and D4 of greater than 6 V would be suitable. Zener diodes D3 and D4 can also act to provide proper gate bias to Q4 and Q5 when the circuit of FIG. 5 is in a current conducting state.

Operation of the circuit of FIG. 5 once current blocking is initiated by TBU core 502 and an external GDT fires as a result, is substantially the same as the circuit of FIG. 3. The initial GDT transient drives the gate voltages of Q4 and Q5 (by capacitive coupling) to values sufficient to turn both Q4 and Q5 hard off. This state persists until the gate-source capacitances of Q4 and Q5 discharge through R3 and R4. Zener diodes D3 and D4 do not substantially alter this behavior.

Figure 6:
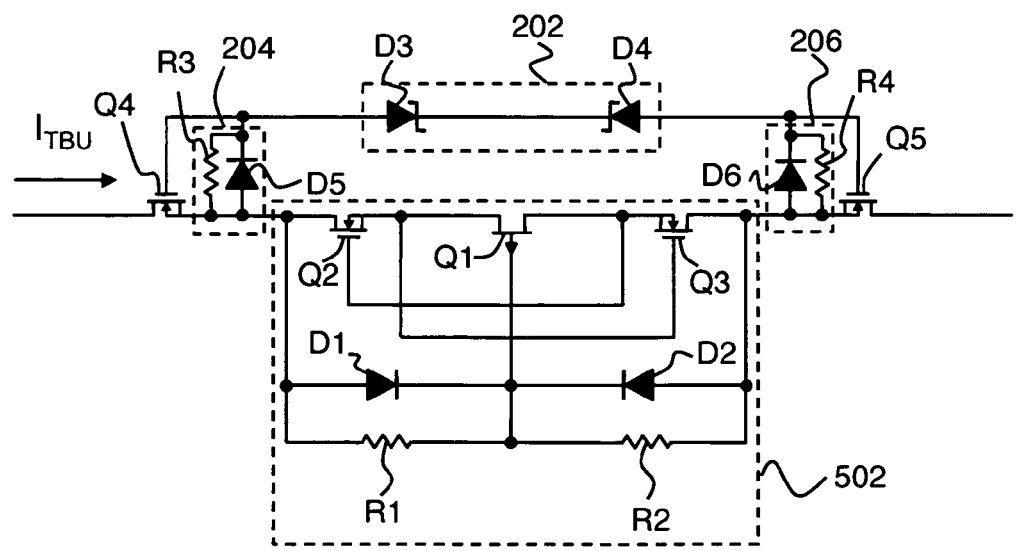
FIG. 6 shows a high voltage transient blocking unit according to a fourth preferred embodiment of the invention.

FIG. 6 shows a high voltage transient blocking unit according to a fourth preferred embodiment of the invention. This circuit is the same as the circuit of FIG. 5, except that Q4 and Q5 are NMOS devices on FIG. 6 and are JFETs on FIG. 5, and gate-source clamp diodes D5 and D6 are added on FIG. 6. Diodes D5 and D6 prevent the development of excessive gate-source voltages at Q4 and Q5.

Another difference between the circuits of FIGS. 3-4 and the circuits of FIGS. 5-6 is that the TBU core is connected to the rest of the circuit differently. More specifically, in the circuits of FIGS. 3-4, TBU core 302 has four connections to the rest of the circuit. Intermediate connections (e.g., to the node between Q1 and Q2, and to the node between Q1 and Q3) are made to provide gate control voltages to Q4 and Q5.

This can be seen more clearly in the conventional circuit of FIG. 1, where the gates of Q4 and Q5 are connected to intermediate nodes of TBU core 102.

In the circuits of FIGS. 5-6, TBU core 502 only has two connections to the rest of the circuit. No connections are made from the surrounding circuit to interior nodes of the TBU core. This configuration demonstrates that TBU core 502 does not directly act to switch off Q4 and Q5. Instead, Q4 and Q5 are switched off by the above-described interaction of transients.

The decision of whether to use a 2-connection or 4-connection configuration of the TBU core is affected by the following considerations. In cases where an offset voltage is needed between the gates of Q4 and Q5 (e.g., FIGS. 5-6), a 2-connection configuration (as shown) is preferred, so that voltage drops in R3 and R4 can contribute to the required total voltage offset. In cases where an offset voltage between the gates of Q4 and Q5 is not required (e.g., FIGS. 3-4), the 4-connection configuration (as shown) is preferred, in order to minimize power dissipation in R3 and R4.

Embodiments of the invention can also be practiced according to many variations of the given examples. Preferably, Q1 of the TBU core is a JFET, and Q2 and Q3 of the TBU core are NMOS devices, as shown. However, embodiments of the invention can be practiced with TBU cores having any types of transistor. Similarly, it is preferred for Q4 and Q5 to be JFETs or NMOS devices (as shown), but Q4 and Q5 can be any kind of transistor.

The invention claimed is:

1. A transient blocking unit (TBU) comprising:
   a) a TBU core comprising three or more depletion mode core transistors connected in series, wherein said TBU core automatically switches to a high-impedance current blocking state when current through said TBU core exceeds a predetermined threshold;
   b) a first depletion mode transistor having a first gate, a first source, and a first drain;
   c) a second depletion mode transistor having a second gate, a second source, and a second drain, wherein said TBU core is connected in series with and between said first and second depletion mode transistors; and
   d) a two-terminal gate-gate circuit having a first terminal and a second terminal, wherein said first terminal of said gate-gate circuit is connected to said first gate, and wherein said second terminal of said gate-gate circuit is connected to said second gate.

2. The transient blocking unit of claim 1, wherein said two-terminal gate-gate circuit comprises a conductive connection of said first terminal to said second terminal.

3. The transient blocking unit of claim 1, wherein said two-terminal gate-gate circuit comprises first and second zener diodes connected in series with opposite diode polarity.

4. The transient blocking unit of claim 1, wherein said first and second depletion mode transistors have higher voltage handling capability than said core transistors.

5. The transient blocking unit of claim 1, wherein said TBU core has two connections to the remainder of said transient blocking unit.

6. The transient blocking unit of claim 1, wherein said TBU core has four connections to the remainder of said transient blocking unit.

7. The transient blocking unit of claim 1, wherein said two-terminal circuit includes only passive electrical elements.

8. The transient blocking unit of claim 1, further comprising a first gate-source network connected to said first gate of said first depletion mode transistor.

9. The transient blocking unit of claim 8, wherein said first gate-source network comprises a resistor through which a gate-source capacitance of said first depletion mode transistor can discharge.

10. The transient blocking unit of claim 8, wherein said first gate-source network comprises a diode connected to said first gate and to said first source.

11. The transient blocking unit of claim 1, further comprising a second gate-source network connected to said second gate of said second depletion mode transistor.

12. The transient blocking unit of claim 11, wherein said second gate-source network comprises a resistor through which a gate-source capacitance of said second depletion mode transistor can discharge.

13. The transient blocking unit of claim 11, wherein said second gate-source network comprises a diode connected to said second gate and to said second source.

* * * * *